United States Patent
Takaku

(10) Patent No.: US 8,429,505 B2
(45) Date of Patent: Apr. 23, 2013

(54) ERROR-CORRECTION DATA GENERATION APPARATUS AND GENERATION METHOD

(75) Inventor: Masahiko Takaku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 12/784,901

(22) Filed: May 21, 2010

(65) Prior Publication Data
US 2010/0313093 A1    Dec. 9, 2010

(30) Foreign Application Priority Data

Jun. 4, 2009    (JP) ................ 2009-135315

(51) Int. Cl.
*H03M 13/00*    (2006.01)

(52) U.S. Cl.
USPC .......................... 714/776; 714/774

(58) Field of Classification Search .............. 714/774, 714/776
See application file for complete search history.

(56) References Cited

U.S. PATENT DOCUMENTS 7,539,926 B1*  5/2009  Lesea ............................ 714/776
8,065,591 B2* 11/2011  Maillet et al. ................. 714/774

OTHER PUBLICATIONS

Pro-MPEG Code of Practice #3 release 2,Pro-MPEG Forum,Jul. 2004.

* cited by examiner

*Primary Examiner* — Sam Rizk
(74) *Attorney, Agent, or Firm* — Canon USA, Inc., IP Division

(57) ABSTRACT

An error-correction data generation apparatus for correcting data to be protected in which an error has occurred, the apparatus includes an input unit configured to input data to be protected and a generation unit configured to generate first correction data to be used in correcting first data to be protected.

16 Claims, 10 Drawing Sheets

FIG. 6

| LCM | COLUMN (1) | COLUMN (2) | COLUMN (3) | MINIMUM REDUNDANCY RATE |
|---|---|---|---|---|
| ... | ... | ... | ... | ... |
| 35 | 7 | 5 | – | 0.34 |
| 36 | 9 | 4 | – | 0.36 |
| 40 | 8 | 5 | – | 0.33 |
| 42 | 7 | 6 | – | 0.31 |
| 45 | 9 | 5 | – | 0.31 |
| 56 | 8 | 7 | – | 0.27 |
| 60 | 12 | 5 | – | 0.28 |
| 60 | 5 | 4 | 3 | 0.20 |
| 63 | 9 | 7 | – | 0.25 |
| 66 | 11 | 6 | – | 0.26 |
| 70 | 10 | 7 | – | 0.24 |
| 72 | 9 | 8 | – | 0.24 |
| 77 | 11 | 7 | – | 0.23 |
| 84 | 12 | 7 | – | 0.23 |
| 88 | 11 | 8 | – | 0.22 |
| 90 | 10 | 9 | – | 0.21 |
| 99 | 11 | 9 | – | 0.20 |
| 104 | 13 | 8 | – | 0.20 |
| 105 | 7 | 5 | 3 | 0.14 |
| 110 | 11 | 10 | – | 0.19 |
| 117 | 13 | 9 | – | 0.19 |
| 126 | 14 | 9 | – | 0.18 |
| 132 | 12 | 11 | – | 0.17 |
| ... | ... | ... | ... | ... |

ERROR-CORRECTION DATA GENERATION APPARATUS AND GENERATION METHOD

BACKGROUND OF THE INVENTION

1. Field of the Invention

The present invention relates to a method for generating error-correction data to be used in correcting an error made in data to be protected.

2. Description of the Related Art

A communication protocol such as a Transport Protocol for Real-Time Applications (RTP) that realizes real-time communication has come into full use along with the popularization of video transmission via a communication network, e.g., the Internet. The RTP is designed to be implemented on a User Datagram Protocol (UDP) having a high-speed and lightweight transmission characteristic, and to consecutively transmit large-volume data such as moving images and voice.

There are methods for increasing robustness against error in communication data transmitted using the above-described communication protocol, such as retransmission control and forward error correction (FEC). In particular, in the FEC method, redundant data to be used in correcting the error in the communication data is transmitted along with the communication data from the transmitting side. The error in the communication data is then corrected on the receiving side.

There are various FEC methods, and a method generally referred to as cross FEC (or 2D-FEC) that employs exclusive OR is widely known as a method whose processing load is relatively small (e.g., refer to Pro-MPEG Code of Practice #3 release 2, Pro-MPEG Forum, July, 2004).

In the cross FEC method, packets to be transmitted are arranged in a matrix of D rows and L columns. The exclusive OR is calculated in each of the column direction and the row direction, and the resulting data becomes the redundant data, which are then packetized and transmitted. As a result, if a packet loss is occurred in a packet group including the redundant data in the column direction or the row direction, the packet can be restored by applying the exclusive OR calculation.

FIG. 10 illustrates a conventional example of a typical cross FEC application. In the example, the packets to be transmitted are arranged in a matrix of 7 rows and 5 columns, and 12 redundant packets are generated. Each rectangle indicates a transmission packet, and data packets 1, 2, 3, 4, and 5 generate an FEC packet f1 in the row direction, and data packets 1, 6, 11, 16, 21, 26, and 31 generate an FEC packet F1 in the column direction. In other words, the FEC packets F1, F2, F3, F4, and F5 are FEC packets (redundant packets) in the column direction, and the FEC packets f1, f2, f3, f4, f5, f6, and f7 are FEC packets (redundant packets) in the row direction.

The cross FEC method transmits the FEC packets in the row direction and in the column direction along with the data packets. Further, for example, if an error occurs in one of the data packets in a row, the error can be corrected using the data packet in which an error has not occurred in the row and the FEC packet in the row direction generated by the data packets in the row.

The error can be similarly corrected using the redundant packet in the column direction. For example, if the data packet 7 is lost, the data packet 7 can be restored using the FEC packet F2 and the data packet group of the second column, or the FEC packet f2 and the data packet group of the second row.

Further, the FEC can be implemented by applying only the redundant packets in the column direction or the redundant packets in the row direction. Such an FEC is referred to as 1D-FEC instead of 2D-FEC.

However, the error may not be corrected using the redundant data depending on a pattern of error occurrence.

For example, if the errors occur in the data packets 7, 9, 12, and 14 illustrated in FIG. 10, the data packets 7 and 9 cannot be corrected even when the exclusive OR is calculated using the redundant packet f2. The data packets 7 and 12 similarly cannot be corrected even when the exclusive OR operation is performed using the redundant packet F2, and the data packet 14 cannot be corrected.

Further, if the errors occur in the data packets 1, 2, 3, 4, 5, 6, 7, and 8, the errors in the data packets 4 and 5 can be corrected using the redundant packets F4 and F5 respectively. However, the errors in the data packets 1, 2, and 3 and the data packets 6, 7, and 8 cannot be corrected using the redundant packets.

If the above-described periodical errors or consecutive errors occur in a communication path, the errors may not be corrected using the redundant data. Further, in the above-described examples, the redundant packets are generated by a method using the exclusive OR. However, if there is a number of packet losses, which exceed an upper limit of a restorable number of packets, the errors cannot be corrected even when employing a method having high redundancy, such as Reed-Solomon coding.

SUMMARY OF THE INVENTION

The present invention is directed to an error-correction data generation apparatus and generation method capable of generating error-correction data that is more useful for a pattern of data loss occurrence.

According to an aspect of the present invention, an error-correction data generation apparatus for correcting data to be protected in which an error has occurred includes an input unit configured to input data to be protected, and a generation unit configured to generate first correction data to be used in correcting first data to be protected in which the error has occurred using second data to be protected that is input later than data to be protected subsequent to the first data to be protected and to generate using the first data to be protected and third data to be protected which is input later than the second data to be protected and without using the second data to be protected, second correction data to be used in correcting the first data to be protected in which the error has occurred.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 6 is an example of a matrix information reference table.

DESCRIPTION OF THE EMBODIMENTS

Various exemplary embodiments, features, and aspects of the invention will be described in detail below with reference to the drawings.

Figure 1:
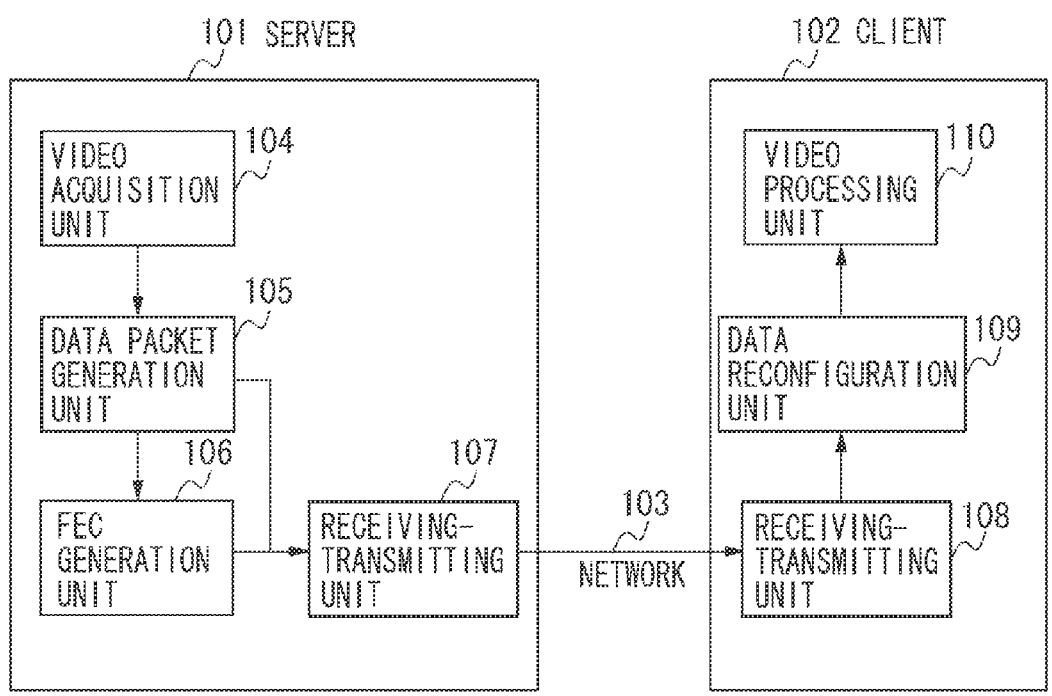
FIG. 1 is a block diagram illustrating functions of a system.

A configuration of a video transmission system according to a first exemplary embodiment of the present invention will be described below with reference to FIG. 1. FIG. 1 is a block diagram illustrating functions of the system.

Referring to FIG. 1, the server 101 includes a communication function for transmitting video data. The server 101 may be realized by a single computer apparatus or a plurality of computer apparatuses. For example, the server 101 may be a camera (imaging apparatus), which includes a communication function. The server 101 generates by using the data packets to be transmitted to a client 102 the redundant packets for correcting the errors, and transmits the redundant packets to the client 102.

In other words, the server 101 is a generation apparatus, which generates the redundant packets (i.e., correction data) for correcting the data packets (i.e., data to be protected) in which the errors have occurred. According to the present exemplary embodiment, the data packets of the video data are transmitted to the client 102. However, the present invention is applicable to audio data and metadata.

The client 102 includes the communication function for receiving the video data transmitted from the server 101. The client 102 may be realized by a single computer apparatus or a plurality of computer apparatuses. For example, the client 102 may be a storage apparatus or a television set, which includes the communication function. The server 101 and the client 102 are connected by a network 103 to be communicable with each other.

The server 101 includes a video acquisition unit 104, a data packet generation unit 105, a FEC generation unit 106, and a receiving-transmitting unit 107. Further, the client 102 includes a receiving-transmitting unit 108, a data reconfiguration unit 109, and a video processing unit 110.

The video acquisition unit 104 in the server 101 acquires the video data to be transmitted to the client 102. The video acquisition unit 104 includes a camera function, which is realized by a video sensor and an encoding module, and acquires the video data to be transmitted to the client 102. Further, the video acquisition unit 104 may acquire the video data by reading the video data from a recording apparatus, which records encoded video data.

The data packet generation unit 105 divides the video data acquired by the video acquisition unit 104 into data sizes appropriate for transmission and thus generates the data packets (i.e., data to be protected). More specifically, when the network 103 is an internet protocol (IP) network and employs the RTP as the communication protocol, the data packets are generally generated as RTP packets of proximately 1500 bytes.

The data packet generation unit 105 then inputs the generated data packets (i.e., data to be protected) to the FEC generation unit 106 and the receiving-transmitting unit 107. According to the present exemplary embodiment, information such as an address of the client 102 included in the data packet is not included in the data to be protected that is corrected using the redundant packet when an error has occurred.

The FEC generation unit 106 generates the redundant packets (i.e., FEC packets) using one or more data packets input from the data packet generation unit 105. The redundant packets (FEC packets) are the error correction packets to be used in correcting the error occurring in the data packet not normally received by the client 102. According to the present exemplary embodiment, the redundant packets are generated using the exclusive OR. However, methods such as the Reed-Solomon coding may also be used.

The receiving-transmitting unit 107 transmits the data packets generated by the data packet generation unit 105 and the redundant packets generated by the FEC generation unit 106. In other words, the receiving-transmitting unit 107 transmits to the client 102 (i.e., a receiving apparatus) the input data packets (data to be protected) and the generated correction data. Further, the receiving-transmitting unit 107 receives a communication information packet transmitted from the client 102.

The receiving-transmitting unit 108 in the client 102 receives the data packets and the redundant packets from the server 101 via the network 103. Further, the receiving-transmitting unit 108 transmits to the server 101 a communication status packet indicating a receiving status of the packets.

The data reconfiguration unit 109 then separates the packets received by the receiving-transmitting unit 108 into the data packets and the redundant packets and reconfigures the video data. Further, the data reconfiguration unit 109 corrects as necessary the errors in the data packets, which have occurred during communication, by using the redundant data and the normally received data packets.

The video processing unit 110 processes the video data reconfigured by the data reconfiguration unit 109. For example, the video processing unit 110 records the video data on a video apparatus or decodes and displays on a display device the video data.

Figure 2:
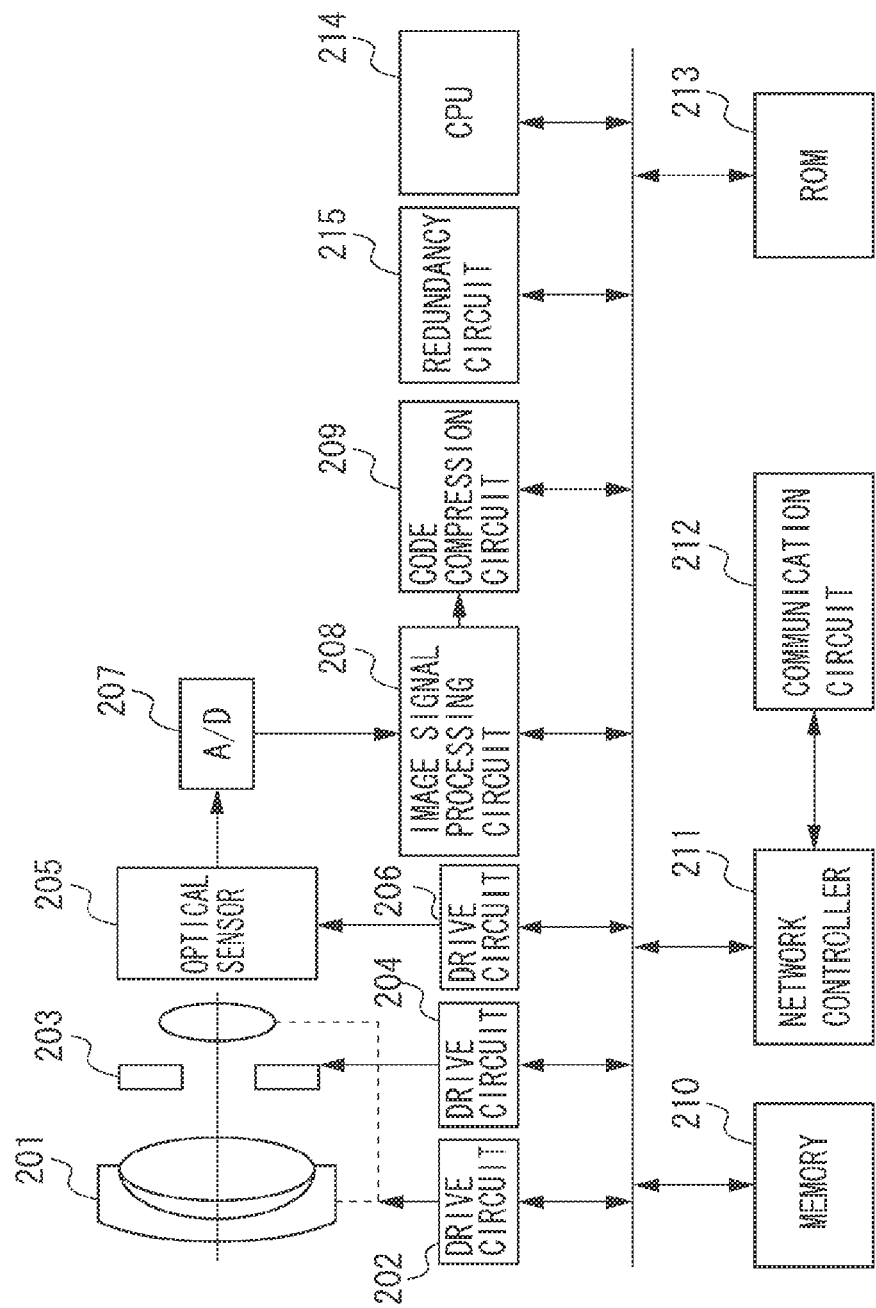
FIG. 2 is a block diagram illustrating a configuration of a server 101.

FIG. 2 illustrates an example of an apparatus configuration in a case where the server 101 is applied to the imaging apparatus that includes the communication function.

Processes described below with reference to FIG. 2 are performed by a central processing unit (CPU) 214 controlling each unit based on a control program (firmware) stored in a read-only memory (ROM) 213. However, the present invention is not limited to such an embodiment, and, for example, at least a portion of the processes to be described below may be realized by accessing a high speed memory 210 using a direct memory access (DMA) circuit.

Referring to FIG. 2, an image of an object to be captured is formed on an optical sensor 205 via an imaging lens unit 201 including an optical system. An imaging lens unit drive circuit 202 controls the imaging lens unit 201. A diaphragm unit drive circuit 204 operates a diaphragm unit 203 including a diaphragm, and appropriately adjusts the amount of light to be imaged.

The optical sensor 205 configured of a solid-state image sensing device (e.g., a charge-coupled device (CCD) sensor or a complementary metal-oxide semiconductor (CMOS)

sensor) converts incoming light to electric charges according to the light amount, and accumulates the electric charges. The electric charges are then read out and digitized by an analog/digital (A/D) conversion unit 207, so that a non-compressed digital image data is generated. An image signal processing circuit 208 then performs white balance correction and gamma correction on the generated digital image data, and transmits the corrected image data to a code compression circuit 209.

The code compression circuit 209 compresses the corrected digital image data using a moving image coding algorithm. For example, a motion Joint Photographic Experts Group (JPEG) format, i.e., a continuous JPEG (International Organization for Standardization/International Electro-technical Commission (ISO/IEC) 10918) coding mode, may be employed as the coding algorithm for the moving image.

Further, coding schemes, which performs inter-frame prediction such as Moving Picture Experts Group (MPEG)-2 (ISO/IEC 13818) or MPEG-4 (ISO/IEC 14496), may be used as the coding algorithm for the moving image. The video data acquired as a result of compression is temporarily stored in the memory 210.

The video acquisition unit 104 illustrated in FIG. 1 thus performs the above-described series of processes.

The CPU 214 arranges the video data temporarily stored in the memory 210 into a format appropriate for communication, and generates the data packets to be transmitted to the client 102. The CPU 214 then temporarily stores the generated data packets in the memory 210. The CPU 214 thus generates the data packets of the video data to be transmitted to the client 102. The above-described process corresponds to the process performed by the data packet generation unit 105.

The CPU 214 then generates the redundant packets with respect to the data packets stored in the memory 210, and stores therein. The process corresponds to the process performed by the FEC generation unit 106. The CPU 214 then transmits the generated data packets and redundant packets to the client 102 via a network controller 211.

According to the present exemplary embodiment, a redundancy circuit 215 instead of the CPU 214 generates the redundant packets described with reference to FIG. 2 for the following reason. If the CPU 214 generates the redundant packets, processing cost increases and other processes are affected depending on the generation pattern and the redundancy of the redundant packets. The redundancy circuit 215 thus generates the redundant packets instead of the CPU 214 in the server 101 according to the present exemplary embodiment.

However, the CPU 214 may also generate the redundant packets. Further, whether the redundant packets are generated by the redundancy circuit 215 or the CPU 214 may be determined by estimating the cost based on the generation pattern and the redundancy of the redundant packets.

Furthermore, a communication circuit 212 may perform processes related to the communication packet. Recently, an off-loading mechanism is in actual use to reduce the process load of the main CPU by disposing a sub-CPU in a communication circuit to perform the processes related to communication. The present configuration may thus be realized by such off-loading of the communication process.

A principle of the error correction using the redundant packets (FEC packets) will be described below. Various methods such as the Reed-Solomon coding are known as methods for correcting the errors using the redundant packets. The method using the exclusive OR according to the present exemplary embodiment will be described below.

For example, it is assumed that there are data A and data B, each data having 2 bytes (16 bits). The exclusive OR is then calculated on the data A and the data B, and data C is acquired as the result. If the data A or the data B among the data A, data B, and data C is lost, the exclusive OR is calculated on the remaining data B and data C or data A and data C, so that the lost data A or data B is acquired as the result.

In the above-described example, it is assumed that there are two data, i.e., data A and data B. However, the calculation can be similarly performed when there is N number of data. Further, if one of (N+1) number of data including the redundant data acquired as the result of calculating the exclusive OR is lost, the lost data can be similarly restored by performing the calculation.

In a method employing the Reed-Solomon coding, a plurality of lost data can be more easily restored. The basic restoration process is similar to using the exclusive OR operation.

The pattern of generating the redundant packets and the error correction process using the redundant packets according to the present exemplary embodiment will be described below with reference to FIG. 3.

According to the present exemplary embodiment, a group of data packets (i.e., data packet 1 to data packet 35) is arranged in logical matrices of a plurality of different number of columns. Referring to FIG. 3, the data packet 1 to data packet 35 are arranged into a matrix 301 of 7 rows and 5 columns and a matrix 303 of 5 rows and 7 columns. The data packet 1 to data packet 35 correspond to data packet 1 to data packet 35 illustrated in FIG. 10.

Further, a transmission order of the data packets is determined based on the numbers assigned to each of the packets. For example, the data packet 2 is transmitted after the data packet 1, and the data packet 35 is transmitted last among the data packet 1 to data packet 35.

The FEC generation unit 106 generates the redundant packets (FEC) for each of the matrix 301 of 7 rows and 5 columns and the matrix 303 of 5 rows and 7 columns in the column direction, i.e., a vertical direction. More specifically, the FEC generation unit 106 generates a redundant packet Fa1 using the data packets 1, 6, 11, 16, 21, 26, and 31 in the first column of the matrix 301.

As described above, if an error occurs in one of the data packets 1, 6, 11, 16, 21, 26, and 31, the error can be corrected by performing the exclusive OR calculation on the other data packets and the redundant packet Fa1.

In other words, the FEC generation unit 106 generates the redundant packet Fa1 (i.e., first correction data) to be used in correcting a data packet 1 (i.e., first data to be corrected) in which an error has occurred. The FEC generation unit 106 generates the redundant packet Fa1 using the data packet 1 and the data packet 6 (i.e., second data to be protected). The data packet 6 is data to be protected which is input later than the subsequent data to be protected (i.e., data packet 2) of the data packet 1 (first data to be protected).

Further, the FEC generation unit 106 generates redundant packets Fa2, Fa3, Fa4, and Fa5 similarly as the redundant packet Fa1.

Furthermore, the FEC generation unit 106 generates a redundant packet Fb1 by using data packets 1, 8, 15, 22, and 29 in the first column of the matrix 303. The FEC generation unit 106 thus generates the redundant packet Fb1 (i.e., second correction data) to be used in correcting the data packet 1 in which the error has occurred as described below.

The FEC generation unit 106 generates the redundant packet Fb1 using the data packet 1 and the data packet 8 (i.e., third data to be protected) without using the data packet 6

(second data to be protected). The data packet 8 (third data to be protected) is data to be protected which is input later than the data packet 6 (second data to be protected).

Further, the FEC generation unit 106 generates redundant packets Fb2, Fb3, Fb4, Fb5, Fb6, and Fb7 similarly as the redundant packet Fb1.

Figure 3:
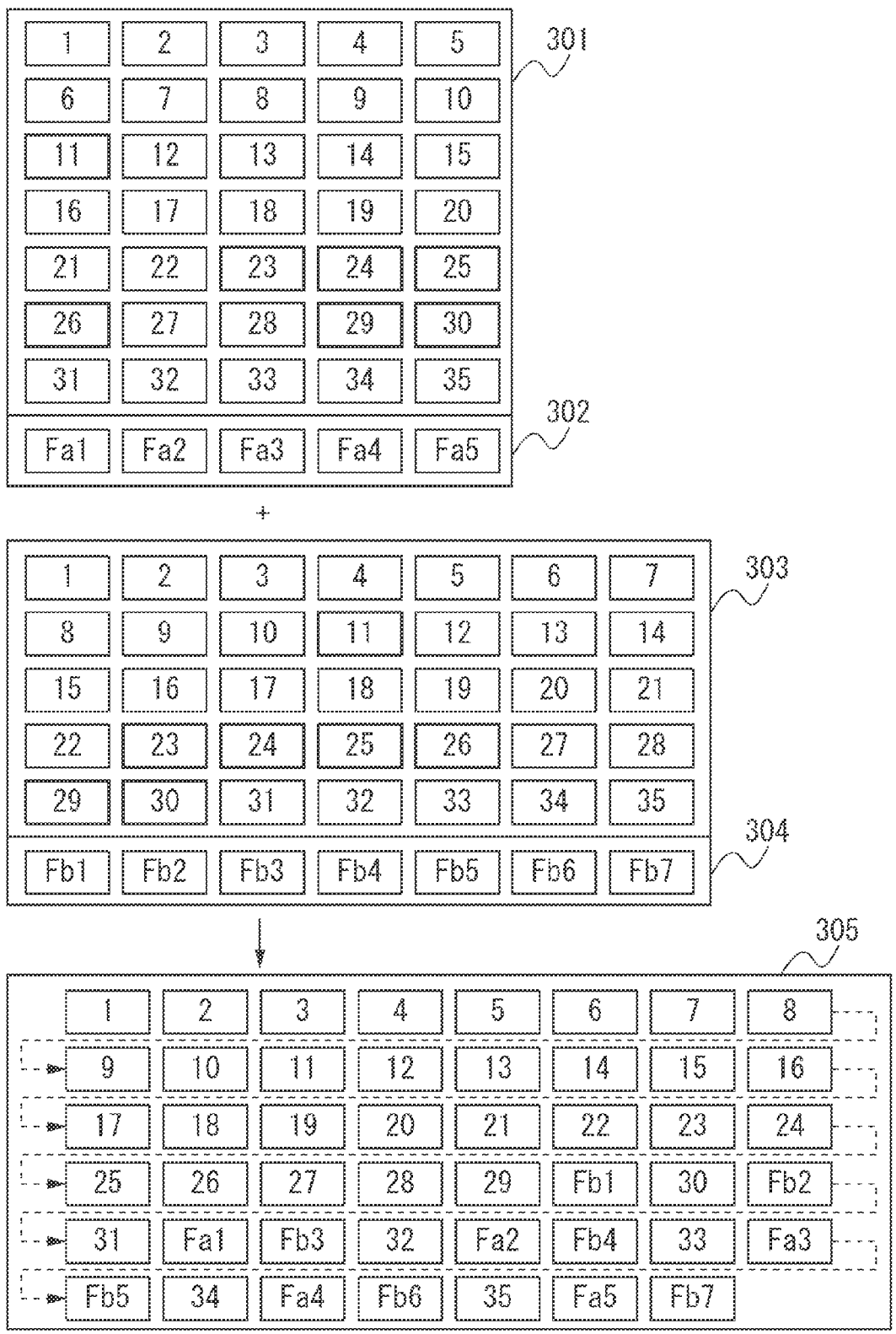
FIG. 3 illustrates an example of a pattern of generating redundant packets.

A communication packet group 305 illustrated in FIG. 3 indicates the transmission order of the data packet 1 to data packet 35, redundant packets Fa1, Fa2, Fa3, Fa4, and Fa5, and redundant packets Fb1, Fb2, Fb3, Fb4, Fb5, Fb6, and Fb7. The receiving-transmitting unit 107 sequentially transmits the data packet 1 to the data packet 29, and then transmits the redundant packet Fb1. In other words, the receiving-transmitting unit 107 transmits the redundant packet Fb1 after transmitting the data packets to be used to transmit the redundant packet Fb1.

Figure 10:
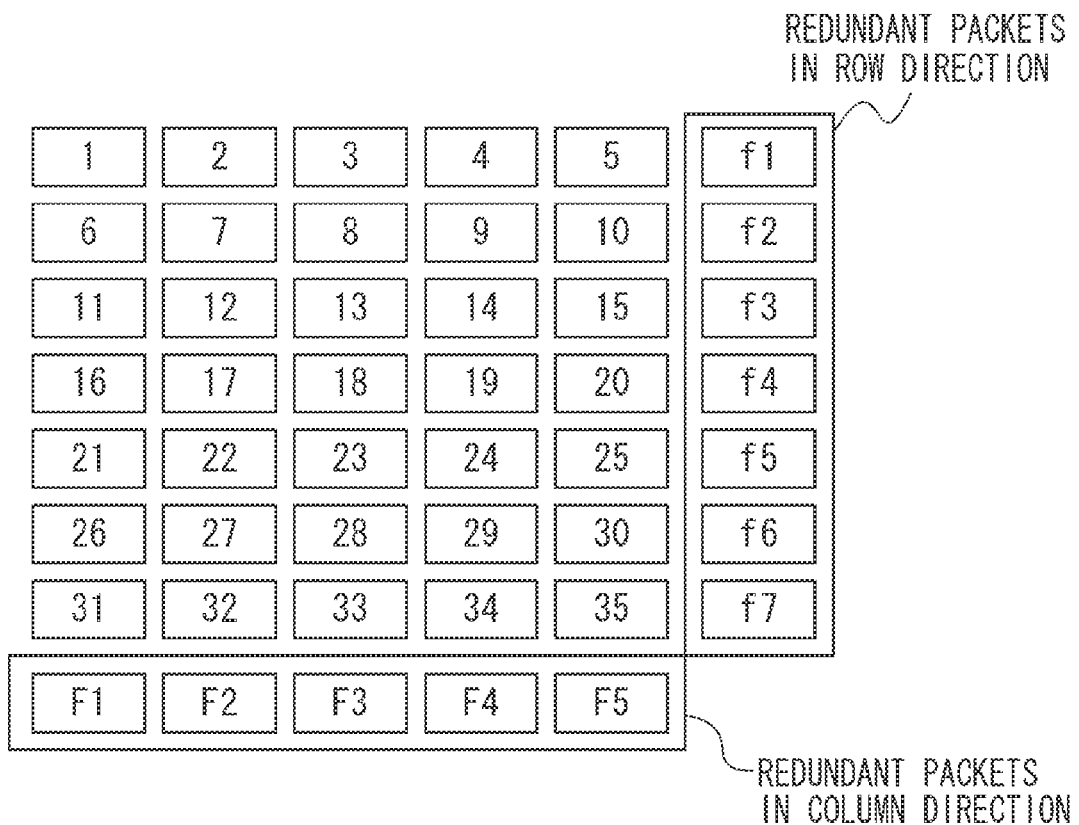
FIG. 10 illustrates a conventional example of a cross FEC application.

Further, the receiving-transmitting unit 107 transmits the 12 redundant packets generated with respect to the 35 data packets as illustrated in the communication packet group 305. 47 packets are thus transmitted, which is the same as the number of transmitted packets illustrated in FIG. 10.

It is then assumed that the data packets 11, 23, 24, 25, 26, 29, and 30 are lost in the communication path corresponding to the network 103 or the communication path connected to the network 103. The lost packets are indicated by thick-lined rectangles illustrated in FIG. 3.

In such a case, the data reconfiguration unit 109 in the client 102 corrects (restores) the error in the data packet 23 using the redundant packet Fa3 for the matrix 301. On the other hand, the data reconfiguration unit 109 corrects the error in the data packets 29, 24, and 26 using the redundant packets Fb1, Fb3, and Fb5 respectively for the matrix 303 of 5 rows and 7 columns.

Further, the matrix 301 corrects the error in the data packet 11 using the data packet 26 in which the error has been corrected. Similarly, the matrix 303 corrects the errors in the data packet 30 and 25.

The errors in all data packets can thus be corrected (restored) by the above-described procedure.

If the data packets are lost as described above and the conventional method illustrated in FIG. 10 is applied, the errors in the data packets 24, 25, 29, and 30 cannot be corrected. Further, if the errors occur in the data packets 7, 9, 12, and 14, the errors cannot be similarly corrected using the redundant packets generated according to the configuration illustrated in FIG. 10. However, the errors can be corrected using the redundant packets generated according to the configuration illustrated in FIG. 3.

Furthermore, if the errors occur in the data packets 1, 2, 3, 4, 5, 6, 7, and 8, the errors in the data packets 1, 2, 3, 6, 7, and 8 cannot be corrected using the redundant packets generated according to the configuration illustrated in FIG. 10. However, all errors can be corrected using the redundant packets generated according to the configuration illustrated in FIG. 3.

As described above, the errors can be corrected in a greater number of data packets by using the method for generating the error-correction data according to the exemplary embodiment as compared to using the conventional method. This is regardless of a degree of redundancy (i.e., the ratio between the number of data packets and the number of redundant packets) being the same as the conventional method.

In the example illustrated in FIG. 3, the numbers of columns in the matrices are 5 and 7, and the only common factor (i.e., a mutually dividable number) between 5 and 7 is 1. As a result, periodicity, i.e., a group of numbers in the same column in one matrix existing in the same column in the other matrix, is not generated until "35" which is the product of 5 and 7.

For example, referring to FIG. 3, the data packets 6, 11, 16, 21, 26, and 31 arranged in the same column as the data packet 1 in the matrix 301 are not arranged in the same column as the data packet 1 in the matrix 303. However, if there is a data packet 36, the data packet 1 and the data packet 36 are arranged in the same column (i.e., the first column) in both the matrix 301 and the matrix 303. In other words, a group of the same data packets is not arranged in the same matrix until the number of data packets reaches 35, which is the least common multiple of 5 and 7.

In contrast, if the numbers of columns are 4 and 8, the group of the same data packets is not arranged in the same matrix until the number of data packets reaches 8, which is the least common multiple. However, the data packets 9, 10, 11, and 12 are arranged in the same column as the data packets 1, 2, 3, and 4. Therefore, if errors occur in the data packets 1 and 9, the errors can be corrected when the numbers of columns are 5 and 7. However, the error cannot be corrected when the numbers of columns are 4 and 8.

As described above, the number of redundant packets with respect to the number of data packets is the same when the numbers of columns are 5 and 7 and when the numbers of columns are 4 and 8. However, the possibility of correcting the errors is higher when the numbers of columns are 5 and 7.

The FEC generation unit 106 thus determines the numbers of columns for a plurality of matrices so that the least common multiple of the numbers of columns becomes greatest. The numbers of columns are determined from a range of available numbers of columns according to the degree of redundancy (a number of redundant packets against a number of data packets).

Figure 4:
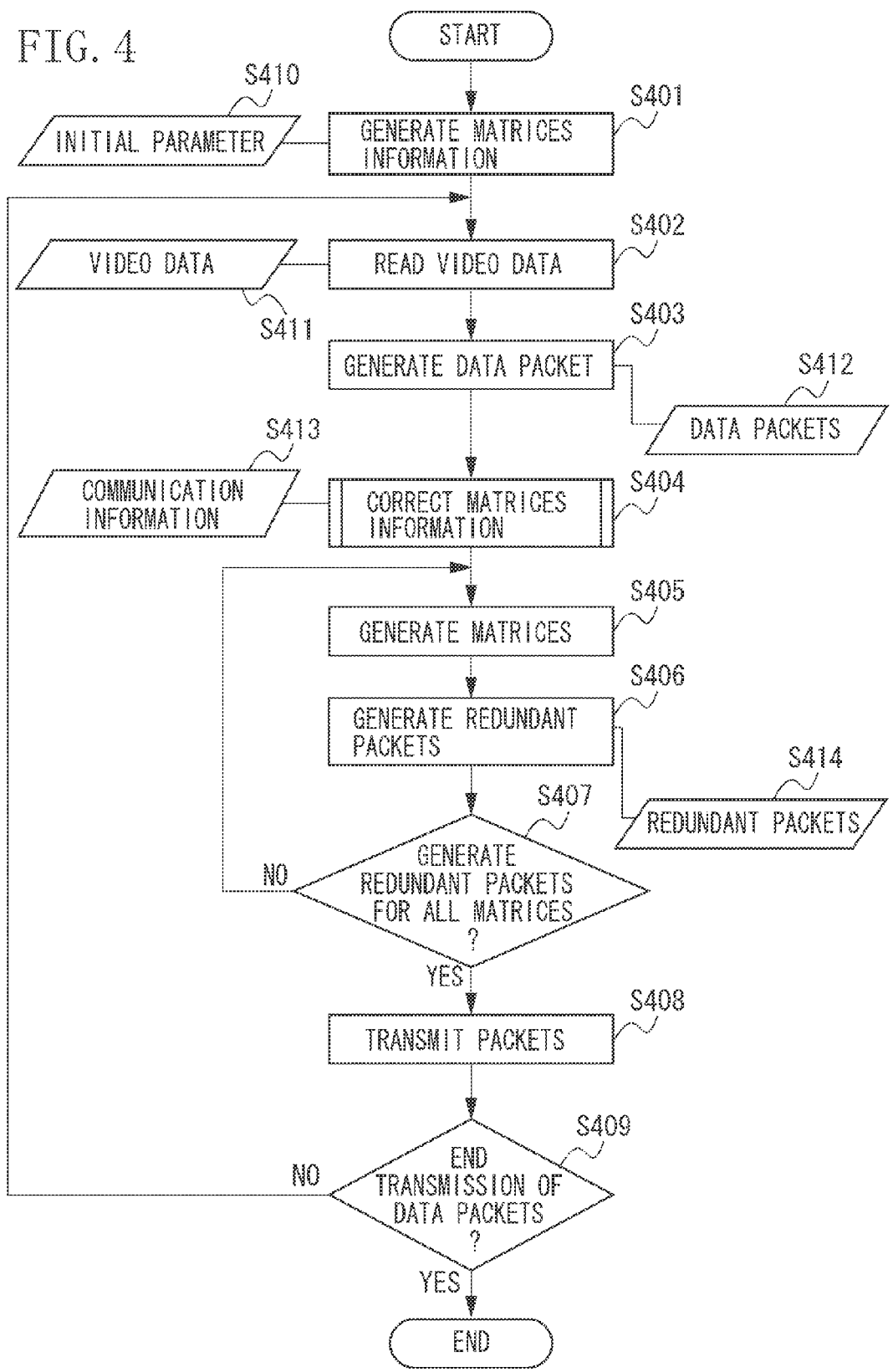
FIG. 4 is a flowchart illustrating an example of a process performed by the server 101.

FIG. 4 is a flowchart illustrating an example of a process performed by the server 101 according to the present invention.

In step S401, the FEC generation unit 106 reads initial parameters 410 as column information. The initial parameters 410 are default values of numbers of rows and columns of the matrices. For example, the initial parameters 410 are information such as (5, 7) and (7, 5) for generating the matrix 301 and the matrix 303 illustrated in FIG. 3.

In step S402, the data packet generation unit 105 reads video data 411 acquired by the video acquisition unit 104. If the video data 411 is a moving image compressed using the MPEG-4 format, the data packet generation unit 105 read one frame or one video packet (one of the video data segmented by a re-synchronization marker) of the video data 411. According to the present exemplary embodiment, the process is performed for each frame.

In step S403, the data packet generation unit 105 generates data packets 412 based on the video data read out in step S402. The data packets for one frame are thus generated.

In the flowchart illustrated in FIG. 4, the data packets 412 are output to a storage area that is different from the storage area in which the video data is stored. However, the present invention is not limited to the above, and separator positions for the video data 411 to be handled as communication packets may be recorded as addresses in the memory storing the video data 411.

In step S404, the FEC generation unit 106 corrects, according to the content of the communication information packet (i.e., communication information 413) transmitted from the client 102, the matrices information generated based on the initial parameters. More specifically, in step S404, the FEC generation unit 106 corrects the numbers of rows and columns based on the initial parameters according to the communication information 413.

However, if the server 101 has previously acquired the communication information 413, the numbers of rows and columns according to the communication information 413 can be acquired in step S401, so that step S404 can be omitted. Step S404 will be described in detail below.

In step S405 (i.e., an input step), the data packet generation unit 105 inputs the data packets generated in step S403 to the FEC generation unit 106. In other words, in step S405, the data packet generation unit 105 inputs the data packets (data to be protected). The FEC generation unit 106 then generates the matrix of the input data packets.

In step S406 (i.e., a generation step), the FEC generation unit 106 generates redundant packets 414 based on the matrix generated in step S405. The method for generating the redundant packets is as described above with reference to FIG. 3.

In other words, in step S406, the FEC generation unit 106 generates the redundant packet Fa1 (the first correction data) to be used in correcting the data packet 1 (the first data to be protected) in which an error has occurred, using the data packet 1 and the data packet 6. The data packet 6 (the second data to be protected) is a data packet that is input later than the data packet 2 subsequent to the data packet 1.

Further, in step S406, the FEC generation unit 106 generates the redundant packet Fb1 (the second correction data) to be used in correcting the data packet 1 (the first data to be protected) in which an error has occurred, using the data packets 1 and 8 instead of the data packet 6 (the second data to be protected). The data packet 8 (the third data to be protected) is a data packet that is input later than the data packet subsequent to the data packet 6 (the second data to be protected).

More specifically, the FEC generation unit 106 generates the redundant packet Fa1 (the first correction data) using the data packets 1, 6, 11, 16, etc., to 31, which are input from the data packet generation unit 105 at 5 data packets interval (i.e., N data packets interval). The FEC generation unit 106 thus generates the redundant packet Fa1 using such a plurality of data to be protected. Further, the FEC generation unit 106 generates the redundant packet Fb1 (the second correction data) using the data packets 1, 8, 15, etc., to 29, which are input from the data packet generation unit 105 at 7 data packets interval (i.e., M data packets interval). The FEC generation unit 106 thus generates the redundant packet Fb1 using such a plurality of data to be protected.

The above-described process is performed for a number of matrices. Since there are two matrices (matrix 301 and matrix 303) in the example illustrated in FIG. 3, the process is performed for the two matrices.

In step S407, the receiving-transmitting unit 107 determines whether the redundant packets are generated in all of the plurality of matrices.

If the receiving-transmitting unit 107 determines that the generation of the redundant packets is completed (YES in step S407), the process then proceeds to step S408. In step S408, the receiving-transmitting unit 107 transmits the data packets and the redundant packets. In other words, in step S407, if the receiving-transmitting unit 107 determines that the redundant packets for one frame are generated for two matrices, the receiving-transmitting unit 107 transmits the data packets and the redundant packets of the frame to the client 102.

In step S409, the receiving-transmitting unit 107 determines whether to end the data packet transmission. For example, if the receiving-transmitting unit 107 receives from the client 102 an end packet indicating video distribution to be ended, the receiving-transmitting unit 107 determines to end the data packet transmission (YES in step S409). The process illustrated in FIG. 4 then ends. On the other hand, if the process illustrated in FIG. 4 is to be continued, the process returns to step S402, and the video data of the next frame is acquired.

The present flowchart is an example, and the order of performing the processes can be changed or the processes can be performed in parallel in implementation. For example, since the redundant packets 414 actually exist for the number of columns, the packet transmission can be performed when each of the redundant packets 414 is generated.

Further, the redundant packets can be generated using the data packets remaining in the memory 210 after previously transmitting the data packets. Furthermore, if there is a plurality of matrices, the redundant packet generation for each matrix performed in step S406 can be performed by parallel processing.

The matrices information correction performed in step S404 will be described in detail below. In step S404, the matrices information (numbers of rows and columns) based on the initial parameters is corrected based on the communication information 413 transmitted from the client 102 (i.e., a receiving apparatus).

Figure 5:
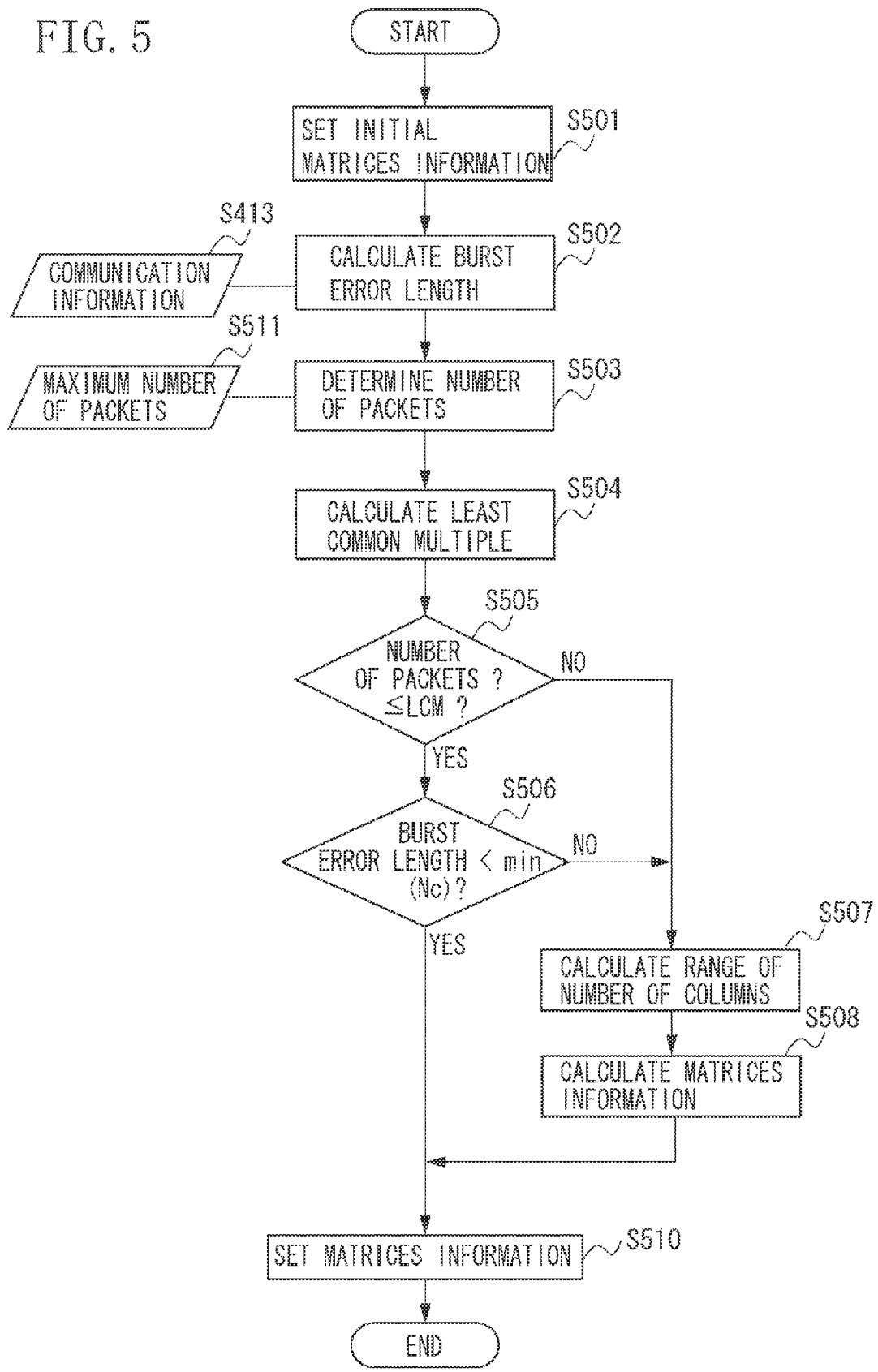
FIG. 5 is a flowchart illustrating an example of a process for changing a pattern of generating redundant packets.

FIG. 5 is a flowchart illustrating an example of a process performed in step S404 illustrated in FIG. 4.

A burst error length is used as the communication information 413 to more specifically describe the process below. The burst error length is a number of communication packets that are consecutively lost.

Other examples of the communication information 413 are communication error rate, effective bandwidth, and redundant rate related to the bandwidth (percentage of the redundant packets with respect to the entire data packets).

The FEC generation unit 106 according to the present exemplary embodiment corrects the numbers of rows and columns (matrices information) to satisfy three conditions described below. The first condition is that the FEC generation unit 106 corrects the numbers of rows and columns so that the least common multiple of the numbers of columns of the plurality of matrices becomes greater than or equal to a maximum number of data packets (maximum number of packets) generated in step S403.

According to the present exemplary embodiment, the data packets are generated for each frame in step S403. The numbers of rows and columns are thus corrected so that the least common multiple of the numbers of columns of the plurality of matrices becomes greater than or equal to the maximum number of data packets.

The maximum number of data packets per 1 frame is the maximum number of data packets generated for the past frames. In other words, the number of data packets generated for each frame is different, and the number of data packets of the frame for which the greatest number of data packets has been generated in the past is stored as the maximum number of packets "511" in the memory 210.

For example, the greatest number of generated data packets of a frame among a predetermined number of frames that have been recently processed (e.g., 100 frames) may be set as the maximum number of packets "511".

In other words, if a first number (i.e., a maximum number of packets) of data to be protected (i.e., data packets) is input, the FEC generation unit 106 generates the redundant packets as described below. The FEC generation unit 106 generates the redundant packet Fa1 (the first correction data) using the data packet 1 (the first data to be protected) and the data packet 6 that is 5th data packet (i.e., N-th data packet) from the data packet 1.

Further, the FEC generation unit 106 generates the redundant packet Fb1 (the second correction data) using the data packet 1 and the data packet 8 that is 6th data packets (M data packets) from the data packet 1. The FEC generation unit 106 determines N and M so that the least common multiple of N and M becomes greater than or equal to the maximum number of packets.

As described above, the same combination of the data packets is not arranged in the same column in a plurality of matrices until the least common multiple of the number of columns is reached. The same combination of data packets can thus be caused to be arranged in different columns in a plurality of matrices by setting the least common multiple of the numbers of columns to be greater than or equal to the maximum number of data packets generated in step S403.

The FEC generation unit 106 thus determines the combination of the data packets to be used in generating the redundant packet Fa1 based on the number of input data to be protected (i.e., the maximum number of packets).

The second condition is that the FEC generation unit 106 corrects the numbers of rows and columns so that the minimum number of columns in the plurality of matrices becomes greater than or equal to the burst error length. The burst error length is determined based on the communication information 413 transmitted from the client 102. In other words, the FEC generation unit 106 determines the data packets to be used along with the data packet 1 to generate the redundant packet Fa1 (the first correction data) according to the communication status (i.e., the burst error length) indicated by the communication status (i.e., the communication information 413).

More specifically, if the burst error length is "6" (i.e., the receiving apparatus failed to receive 6 consecutive data packets), the FEC generation unit 106 sets the minimum number of columns to 7. If the burst error length is 8, the FEC generation unit 106 sets the minimum number of columns to 9. If the receiving apparatus thus failed to receive 6 consecutive data packets, the FEC generation unit 106 sets the data packet 7 which is 6th data packet (N-th data packet) from the data packet 1 to be the data packet to be used in generating the redundant packet Fa1.

Further, if the receiving apparatus failed to receive 8 consecutive data packets, the FEC generation unit 106 sets the data packet 9 that is 8th data packet (M-th data packet) from the data packet 1 to be the data packet to be used in generating the redundant packet Fa1. Burst error tolerance is thus improved by setting all the numbers of columns in the plurality of matrices to be greater than the burst error length.

The third condition is that the FEC generation unit 106 determines the numbers of rows and columns so that the maximum number of columns becomes less than or equal to a quotient acquired by dividing the minimum value of the number of data packets generated in step S403 by 2. The redundant packet is thus generated using "2" or more data packets.

The FEC generation unit 106 according to the present exemplary embodiment stores the minimum number of data packets generated with respect to the past frames similarly as the maximum number of packets.

In step S404 according to the present exemplary embodiment, if the matrices information (numbers of rows and columns) determined by the initial parameter satisfies the above-described three conditions, the FEC generation unit 106 does not correct the matrices information. On the other hand, if the matrices information does not satisfy the three conditions, the FEC generation unit 106 corrects the matrices information. However, it is not essential for the matrices information to satisfy the three conditions.

Referring to the flowchart illustrated in FIG. 5, in step S501, the FEC generation unit 106 reads the matrices information determined in step S401 based on the initial parameters 410. The FEC generation unit 106 then sets the read matrices information as initial matrices information.

In step S502, the FEC generation unit 106 acquires the burst error length based on the communication information 413 received by the receiving-transmitting unit 107. If the burst error length information is included in the communication information 413, such information is used. Instead of the burst error length information, the communication information 413 may include identification information (e.g., sequence number) of the communication packet (data packet or redundant packet) in which an error has occurred. In such a case, the FEC generation unit 106 acquires the burst error length based on the identification information.

Further, if a plurality of burst errors are generated, an average value of the burst error lengths, a longest burst error length, or a most frequently acquired burst error length can be employed as the burst error length.

In step S503, the FEC generation unit 106 determines a maximum number of the data packets configuring one matrix. As described above, the maximum number of packets is the maximum number of the data packets generated for 1 frame among the past processed frames. Further, the maximum number of packets is stored in the memory 210. The FEC generation unit 106 thus reads a maximum number of frames 511 as the maximum number of packets.

However, there are other methods for determining the maximum number of packets. For example, a number acquired by dividing the video data length read in step S402 by the data packet length may be employed.

Further, there is a case where an upper limit value is set to the number of data packets to be used in generating the redundant packets due to a restriction on the memory. In such a case, the maximum number of packets is determined as the smaller one of the maximum number of packets read from the memory 210 and the set upper limit value of the number of data packets.

For example, the maximum number of packets may be determined as the smaller one of the maximum number of packets read from the maximum number of packets "511", and the set upper limit value. In step S504, the FEC generation unit then calculates the least common multiple (LCM) of the numbers of columns in the initial maximum information.

In step S505, the FEC generation unit 106 determines whether the maximum number of packets determined in step S503 is less than or equal to the LCM calculated in step S504. In other words, the FEC generation unit 106 determines whether the initial matrices information satisfies the above-described first condition. The initial matrices information is the matrices information (numbers of rows and columns) based on the initial parameters set in step S501.

If the initial matrices information satisfies the first condition (YES in step S505), the process proceeds to step S506. If the initial matrices information does not satisfy the first condition (NO in step S505), the process proceeds to step S507. In step S506, the FEC generation unit 106 determines whether the burst error length acquired in step S502 is less than a minimum number of columns min (Nc).

More specifically, in step S506, the FEC generation unit 106 determines whether the initial matrices information satisfies the above-described second condition. If the initial matrices information satisfies the second condition (YES in step S506), the process proceeds to step S510, and if not (NO in step S506), the process proceeds to step S507.

According to the flowchart illustrated in FIG. 5, whether the third condition is satisfied is not determined. However, the determination may be performed between step S506 and step S510. In other words, after determining that the second condition is satisfied, the FEC generation unit 106 may determine whether the maximum number of columns among the plurality of matrices based on the initial matrices information is less than or equal to the quotient acquired by dividing the maximum number of packets by 2.

If the FEC generation unit 106 then determines that the third condition is satisfied, the process proceeds to step S510. On the other hand, if the FEC generation determines that the third condition is not satisfied, the process proceeds to step S507 in which the matrices information is corrected.

In step S507, the FEC generation unit 106 calculates the range of the number of columns that satisfies the above-described first, second, and third conditions. The FEC generation unit 106 calculates it based on the burst error length acquired in step S502 and the maximum number of packets determined in step S503.

For example, the burst error length is set to the minimum number of columns in the plurality of matrices (second condition). Further, the quotient acquired by dividing the number of packets by 2 is set to the maximum number of columns (third condition). It is not essential to calculate the range of the number of columns.

In step S508, the FEC generation unit 106 calculates the matrices information that is included in the range of number of columns.

The process performed by the FEC generation unit 106 in step S508 will be described in detail below. According to the present exemplary embodiment, a case where two matrices are generated will be described.

The FEC generation unit 106 calculates a square root of the maximum number of packets. The FEC generation unit 106 then sets a largest prime number among prime numbers less than or equal to the square root and greater than the burst error length as a first candidate for the number of columns.

The FEC generation unit 106 then divides the maximum number of packets by the first candidate for the number of columns. If the maximum number of packets is dividable by the first candidate for the number of columns, the quotient is set as a second candidate for the number of columns. The first and second candidates for the number of columns are thus directly employed as the numbers of columns in the matrices information.

On the other hand, if the maximum number of packets is not dividable, the largest prime number among prime numbers larger than the minimum number of columns (i.e., burst error length) and less than or equal to the quotient is set as the second candidate for the number of columns. The maximum number of packets is then divided by the second candidate for the number of columns, and the first candidate for the number of columns is changed to a value acquired by adding 1 to the quotient.

If there is no prime number in each of the above-described processes, a maximum integer matching each of the conditions is employed instead of the prime number. As a result, the numbers of columns satisfying the condition of the matrix is calculated. The numbers of rows can be acquired by employing the numbers of columns of the other matrix. However, if it is necessary to generate more redundant packets, the number of rows may be set small.

According to the above-described calculation method, two numbers of columns are determined so that the numbers are close to each other as possible. The number of redundant packets generated with respect to the number of data packets can thus become small. However, if a greater number of redundant packets can be generated, the two numbers of columns may be determined as greatly different numbers with each other.

Further, according to the above-described calculation method, if the square root of the maximum number of packets is smaller than the burst error length, the burst error length can be set to the first candidate for the number of columns. A number of columns that is larger than the first candidate for the number of columns can then be set as the second candidate for the number of columns, so that the two numbers of columns can be determined.

The above-describe example is an example of a method for calculating the numbers of columns. However, the present invention is not limited to such an example, and the number of columns may be calculated using a Pollard's rho algorithm to factorize the number of packets into prime numbers. The numbers of columns can then be acquired by grouping the result into factors for the number of matrices in which there is no conjugate numbers.

Further, according to the flowchart illustrated in FIG. 5, the LCM is set to be greater than or equal to the maximum number of packets. However, a common multiple may be used instead of the LCM. In such a case, the error tolerance is reduced at periods corresponding to the quotient acquired by dividing the common multiple by the LCM.

The process performed in step S404 can be simplified by using a table of the matrices information. FIG. 6 illustrates an example of a matrices information table.

Referring to FIG. 6, the matrices information table illustrates examples in which the least common multiple LCM is 35 to 132. Further, there are different combinations of numbers of columns with respect to each value of the LCM.

The matrices information table illustrated in FIG. 6 stores data of least common multiple (LCM) 601, column (1) 602, column (2) 603, column (3) 604, and minimum redundancy rate 605. Column (1) 602, column (2) 603, and column (3) 604 each indicate the number of columns of each matrix. For example, an entry in which the LCM 601 is 35 indicates that the numbers of columns in the matrices are 7 and 5.

The FEC generation unit 106 can thus determine the number of columns of each matrix by selecting the entry in the matrices information table so that the maximum number of packets acquired in step S503 is less than or equal to the value of LCM 601. For example, if the maximum number of packets is 38, the FEC generation unit 106 selects the entries in which values of the LCM 601 are 38 or greater. In such a case, the entry in which the value of the LCM 601 is 40 is selected.

The minimum redundancy rate 605 is a result acquired by dividing the total number of redundant packets 414 generated when configuring the matrices using the numbers of columns in each entry by the number of data packets. However, since the number of rows can be changed to increase the redundancy rate as described above, the redundancy rate may become greater.

The process for determining the matrices information to be used in performing correction will be described in detail below by referring to an example in which the maximum number of packets acquired in step S503 is 36.

The method of using the square root calculation will be described below. The FEC generation unit 106 calculates the square root of the maximum number of packets, i.e., 36. The result is exactly 6. The FEC generation unit 106 thus employs 5 as the prime number smaller than 6, so that the first candidate for the number of columns becomes 5.

The FEC generation unit 106 then divides the maximum number of packets, i.e., 36, by the first candidate for the number of columns, i.e., 5, and acquires 7.2. Since the prime number smaller than 7.2 is 7, the second candidate for the number of columns becomes 7. The FEC generation unit 106 divides the maximum number of packets, i.e., 36, by the second candidate for a number of columns, i.e., 7, and acquires 5 with a remainder 1. The first candidate for the number of columns thus becomes 6, which is 1 added to 5. As a result, the acquired numbers of columns are 7 and 6.

A procedure for calculating the numbers of columns by employing prime factorization will be described below. The FEC generation unit 106 performs prime factorization on the maximum number of packets, i.e., 36, and acquires 2×2×3×3. The combinations of the numbers of columns acquired by such a result expressed in form of (A, B) then become (2, 18), (3, 12), (4, 9), and (6, 6). However, since the two matrices become the same by the combination (6, 6), the combination is omitted. Further, since the LCM of (2, 18) and (3, 12) do not become 36, these combinations are also omitted. The resulting numbers of columns are thus 4 and 9.

In other words, the FEC generation unit 106 determines the combination of the data packets to be used in generating the redundant packet Fa1 (the first correction data) based on the value acquired by performing prime factorization of the number of input data to be protected (i.e., maximum number of packets).

It is then determined whether the number of columns 4 in the combination of 4 and 9 is greater than the burst error length. If the burst error length is greater than 4, the prime number that is greater than or equal to the burst error length becomes the first candidate for the number of columns. The second candidate for the number of columns can then be determined from the maximum number of packets and the first candidate for the number of columns.

Further, the number of redundant packets to be generated can be decreased by setting the combination of the numbers of columns so that the shape of the matrix becomes close to a square. For example, the numbers of columns among the combinations of the calculated plurality of numbers of columns by which the shapes of the two matrices become closest to a square may be employed.

On the other hand, if the shapes of the two matrices are greatly different, the number of redundant packets increases. However, the probability of correcting the error by one matrix increases. If the error is corrected by one matrix, the time for correcting the error can be shortened as compared to correcting the error by combination of the two matrices.

Therefore, if it is possible to generate a large number of redundant data, the calculated combination of the plurality of numbers of columns by which the shape of the two matrices becomes greatly different may be employed.

Further, whether the shapes of a plurality of matrices to be generated are to be similar or greatly different may be determined based on an allowable delay time. More specifically, if the time between transmitting the data packets from the server 101 to reproducing the data packets by the client 102 is short, a portion of the numbers of columns among the plurality of matrices can be set to a large value so that the error can be corrected in shorter time.

On the other hand, if the time between transmitting the data packets from the server 101 to reproducing the data packets by the client 102 is long, or if the client 102 only records the data packet, the shapes of the plurality of matrices can be determined similar. As a result, the number of packets to be transmitted can be decreased.

A procedure for determining the numbers of columns by referring to the matrices information table illustrated in FIG. 6 when the maximum number of packets is 36 will be described below.

The FEC generation unit 106 refers to the entries in which the maximum number of packets is 36 or greater, and determines the numbers of columns. For example, the numbers of columns 9 and 4 in the entry in which the LCM 601 is 36 may be employed. Further, if a combination in which the two numbers of columns are similar is to be employed, the numbers of columns 7 and 6 in the entry in which the LCM 601 is 42 may be employed.

As described above, the correction data generation method according to the present invention can realize a higher error correction rate by using a redundant data amount of a same level as 2D-FEC.

A case where the present invention is applied to the RIP will be described below. Video transmission using the RIP proposed by the Internet Engineering Task Force (IETF) is standardized so that the FEC packet is transmitted in a different session from the normal RTP packet when the FEC is applied to the RTP. The RTP packet corresponds to the data packet 412, and the FEC packet corresponds to the redundant packet according to the present exemplary embodiment.

The FEC packet according to IETF specification records information based on the number of columns, along with a smallest sequence number among the RTP packets used in generating the FEC packet. The information based on the number of columns is recorded as a bit mask. The result of the FEC operation is then stored in the FEC packet.

For example, if the smallest sequence number among the sequence numbers of a plurality of RTP packets to be used in generating the FEC packet is 123, and the number of columns is 5, "123" and a mask formed of a repetition of (00001) b are recorded.

The number of repetition described above matches the number of rows. More specifically, if the number of rows is 7, "123" and (00001000010000100001000010000100001) b are recorded. In the subsequent FEC packet, "124" and a mask formed of a repetition of (00001) b are recorded. The value written as ( )b indicates that the value is a binary value, i.e., a bit string.

According to the present exemplary embodiment, the matrices of 5 columns and 7 columns are generated at the same time. The FEC packet in which "123" and the mask formed of a repetition of (0000001) b are set is thus also generated.

If a loss or a bit error of the RTP packet is detected, the client 102 searches for the FEC packet corresponding to the RTP packet in which the error has occurred from the above-described header information. The client 102 can then perform the error correction process.

When the FEC packet header is generated based on the above-described conventional method, the FEC packet header becomes excessively large particularly when there is a great number of columns. Therefore, the FEC generation unit 106 according to the present exemplary embodiment designates the numbers of rows and columns instead of the bit mask to generate the FEC packet header information.

Figure 7:
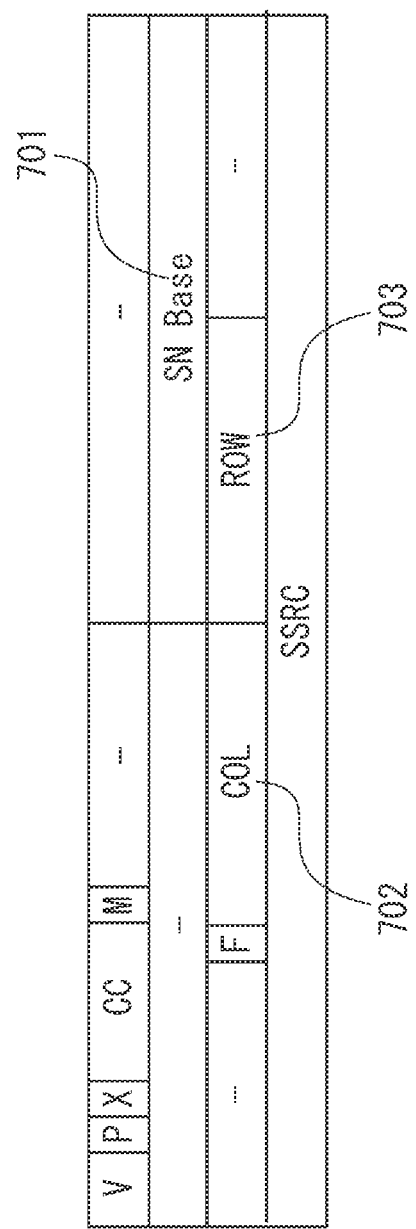
FIG. 7 illustrates an example of a FEC packet structure according to an exemplary embodiment of the present invention.

Such an example is illustrated in FIG. 7. FIG. 7 illustrates an example of a FEC packet structure formed of the numbers of rows and columns.

Referring to FIG. 7, SN Base 701 indicates the smallest sequence number of the corresponding RTP packets. Such data is also included in the conventional FEC packet. COL 702 indicates the number of columns in the matrix, and ROW 703 indicates the number of rows.

For example, the FEC generation unit 106 sets to the FEC packet generated based on the matrix whose number of columns is 5 and the number of rows is 7, the sequence number to SN Base 701, 5 to COL 702, and 7 to ROW 703. The client 102 can then recognize that the received FEC packet is an FEC packet generated using an RTP packet having the sequence number indicated in SN Base 701 and 7 RTP packets which are each 5th packet from the RTP packet.

As described above, the FEC generation unit 106 according to the present exemplary embodiment records the numbers of rows and columns instead of the conventional mask. As a result, the data amount of the FEC packet can be reduced.

The present invention can also be applied to the redundant packet generation that does not use the exclusive OR. According to the first exemplary embodiment, the method employing the exclusive OR described in the background technique is implicitly applied in the example of the redundant packet generation. However, as described above, the present invention can be realized by employing other FEC techniques such as the Reed-Solomon coding.

The Reed-Solomon coding is a coding technique that is employed due to its high error correction capability as an error correction method in various applications such as satellite-based communication and digital versatile disk (DVD). The Reed-Solomon coding can be applied to correcting errors occurring in a plurality of packets. The error tolerance can thus be increased by using such a method of high error correction capability for the present invention.

According to the first exemplary embodiment, the plurality of redundant packets are generated in the column direction. However, the present invention can also be applied to generating the redundant packets in the row direction.

Figure 8:
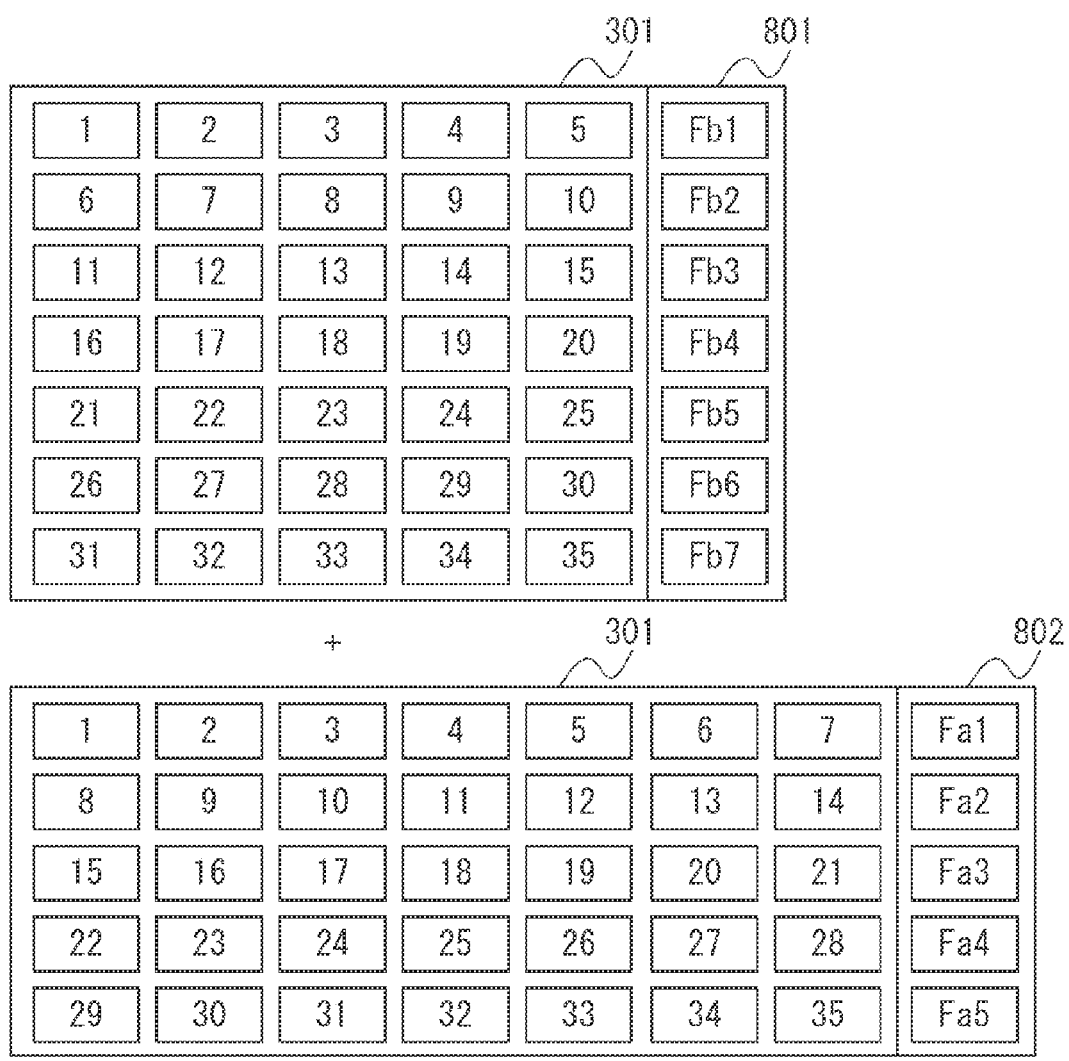
FIG. 8 illustrates an example of a pattern of generating redundant packets.

FIG. 8 illustrates an example of generating the redundant packets in the row direction. Referring to FIG. 8, if errors have occurred in the data packets 11, 15, 21, and 25, the errors cannot be corrected using 2D-FEC illustrated in FIG. 10. However, the errors can be corrected by generating the redundant data in the row direction for each of the plurality of matrices as illustrated in FIG. 8.

More specifically, error correction is performed on each of the data packets 11 and 25 in which the errors have occurred, using redundant packets Fa2 and Fa4 in a matrix 802. Error correction is then performed on each of the data packets 15 and 25 in which the errors have occurred, using redundant packets Fb3 and Fb5 in a matrix 801.

The present exemplary embodiment can also be realized by a similar configuration to that of the server 101 illustrated in FIG. 1. The data packet generation unit 105 thus generates the data packets (data to be protected).

The FEC generation unit 106 then generates the redundant packet Fb1 (the first correction data) to be used in correcting the data packet 1 (the first data to be protected) in which the error has occurred, using the data packet 1 and the data packets 2, 3, 4, and 5 according to the matrix configuration illustrated in FIG. 8. The data packets 2, 3, 4, and 5 are four (N) consecutive data to be protected following the data packet 1 (the first data to be protected).

Further, the FEC generation unit 106 generates the redundant packet Fa1 (the second correction data) to be used in correcting the data packet 1 in which the error has occurred. More specifically, the FEC generation unit 106 generates the redundant packet Fa1 using the data packet 1 (the first data to be protected) and the data packets 2, 3, 4, 5, 6, and 7. The data packets 2, 3, 4, 5, 6, and 7 are six (M) consecutive data to be protected following the data packet 1 (the first data to be protected).

As described above, according to the present exemplary embodiment, the FEC packets are generated in the row direction of each of the plurality of matrices. As a result, the error correction capability is similarly improved.

The present invention may be applied to recording data on a recording medium in addition to data transmission via the IP network.

Generally, when data is recorded on the recording medium, the data is divided into recording units unique to the recording medium of a fixed length such, as 2048 bytes, instead of consecutively recording the entire data. Information for connecting such recording units to collectively handle the data is separately recorded. The present invention can be applied to the recording medium by regarding the recoding units unique to the recording medium as the data packets 412.

Figure 9:
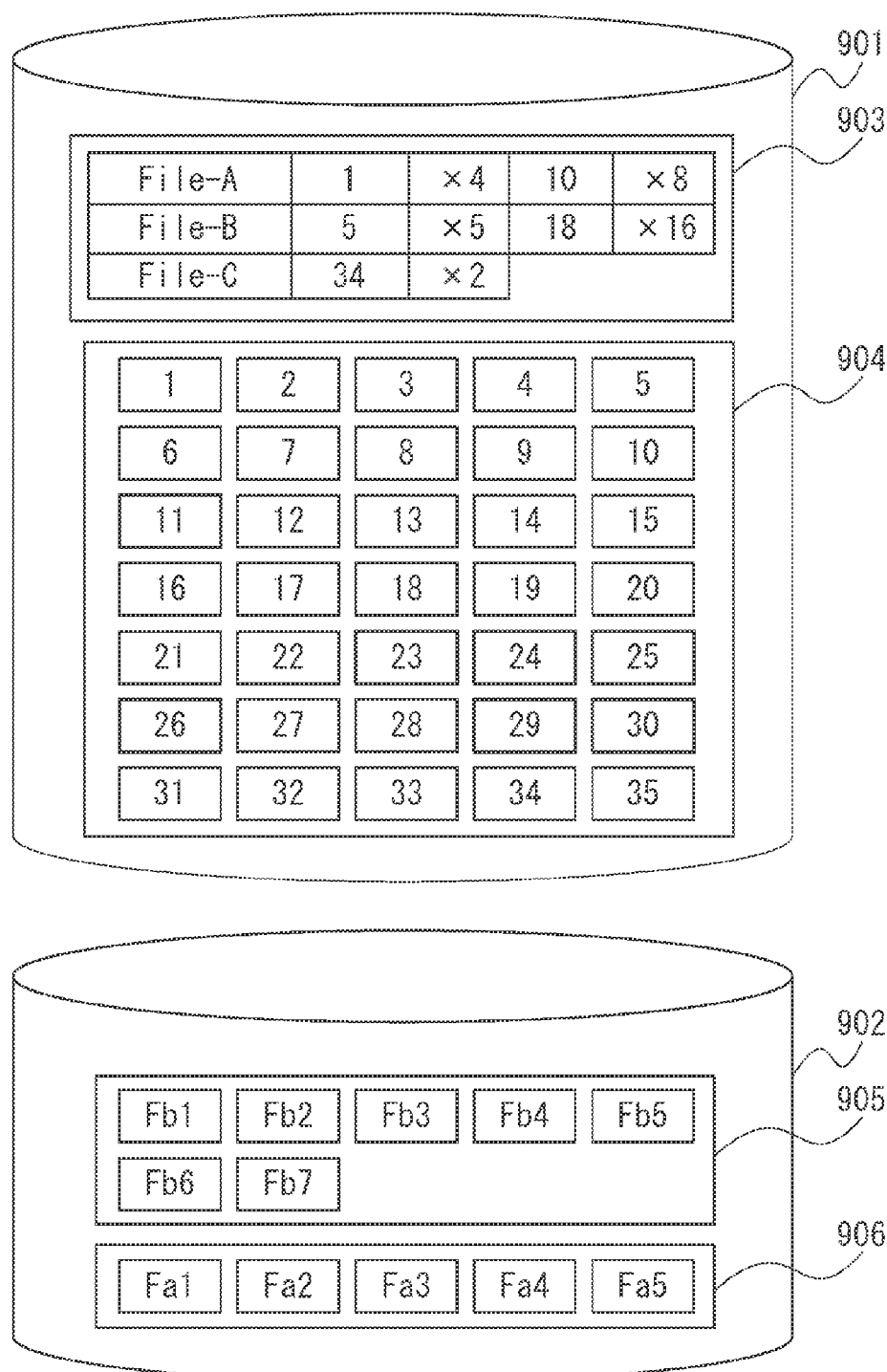
FIG. 9 is a schematic diagram illustrating an application example of a recording medium.

FIG. 9 illustrates an example of applying the present invention to such a recording medium.

Referring to FIG. 9, the recording medium includes two disk apparatuses. A first disk apparatus 901 is a general file system, and stores a logical file table 903 and a data group 904 recorded in recording units unique to the recording medium. A second disk apparatus 902 stores a first redundant data group 905 and a second recording data group 906 recorded in recording units unique to the recording medium.

According to the present exemplary embodiment, the data group 904 is not consecutive data of a single file. The logical file data table 903 records three logical files, i.e., File-A, File-B, and File-C. The logical files are associated with data in the data group 904 by a number recorded subsequent to the table entry and a code to which x is added. For example, File-A includes four consecutive recording units starting from No. 1, and eight consecutive recording units from No. 10.

FIG. 9 is illustrated in a similar configuration as in FIG. 3 to clarify the description. The data group 904 illustrated in FIG. 9 can be similarly regarded as the matrix 301 of 7 rows and 5 columns and the matrix 303 of 5 rows and 7 columns. Further, the first redundant data group 905 and the second redundant data group 906 can be regarded to be the same as the redundant packets 302 of 7 rows and 5 columns and the redundant packets 304 of 5 rows and 7 columns.

The above-described correction data generation method is similar to the method performed by the server 101 described in the first exemplary embodiment. However, the server 101 according to the present exemplary embodiment records the generated redundant data group in a recording area in the server 101 instead of transmitting thereof to the client 102 which displays the video based on the data packets. In other words, in step S408 of the first exemplary embodiment, the FEC generation unit 106 according to the present exemplary embodiment records in a recording unit the generated correction data (i.e., redundant data groups 905 and 906). The FEC generation unit 106 thus operates as a recording control unit.

The data packet generation unit 105 records in the recording unit the input data to be protected (data group 904). Further, the data packet generation unit 105 may record the input data to be protected in an external device such as the client 102. According to the present exemplary embodiment, the error tolerance of the recording data can be improved.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-135315 filed Jun. 4, 2009, which is hereby incorporated by reference herein in its entirety.

What is claimed is:

1. An error-correction data generation apparatus for correcting data to be protected in which an error has occurred, the apparatus comprising:
an input unit configured to input data to be protected; and
a generation unit configured to generate first correction data to be used for correcting first data to be protected in which the error has occurred, using a plurality of pieces of data to be protected that include the first data to be protected and are input every N pieces of data to be protected, and to generate second correction data to be used for correcting the first data to be protected in which the error has occurred, using a plurality of pieces of data to be protected that include the first data and are input every M pieces of data to be protected, so that the first correction data and the second correction data are generated for each input data to be protected.

2. The error-correction data generation apparatus according to claim 1, further comprising a transmission unit configured to transmit to a receiving apparatus the input data to be protected and the first and second generated correction data.

3. The error-correction data generation apparatus according to claim 1, further comprising a recording control unit configured to cause a recording unit to record the input data to be protected and the first and second generated correction data.

4. The error-correction data generation apparatus according to claim 1, wherein the generation unit determines a combination of data to be protected to be used in generating the first correction data, based on a number of the input data to be protected.

5. The error-correction data generation apparatus according to claim 1, wherein the generation unit generates, in response to an input of a first number of data to be protected, the first correction data and determines M and N so that a least common multiple of M and N becomes greater than or equal to the first number of data to be protected.

6. The error-correction data generation apparatus according to claim 1, further comprising:
a transmission unit configured to transmit to a receiving apparatus the input data to be protected and the generated correction data; and
a receiving unit configured to receive from the receiving apparatus communication status information indicating a communication status,
wherein the generation unit determines data to be protected to be used for generating the first correction data, according to communication status indicated by the communication status information.

7. The error-correction data generation apparatus according to claim 1, wherein the generation unit determines N and M, based on a value acquired by performing prime factorization on a number of the input data to be protected.

8. An error-correction data generation apparatus for correcting data to be protected in which an error has occurred, the apparatus comprising:
an input unit configured to input data to be protected; and
a generation unit configured to generate first correction data to be used for correcting first data to be protected in which the error has occurred, using the first data to be protected and N pieces of consecutively input data to be protected after the first data to be protected, and to generate second correction data to be used for correcting the first data to be protected in which an error has occurred, using the first data to be protected and M pieces of consecutively input data to be protected after the first data to be protected.

9. The error-correction data generation apparatus according to claim 8, wherein the generation unit generates, in response to an input of a first number of data to be protected, the first correction data and determines M and N so that a least common multiple of M and N becomes greater than or equal to the first number of data to be protected.

10. The error-correction data generation apparatus according to claim 8, wherein the generation unit determines N and M, based on a value acquired by performing prime factorization on a number of the input data to be protected.

11. A generation method performed by an error-correction data generation apparatus for correcting data to be protected in which an error has occurred, the method comprising:
inputting data to be protected;
generating first correction data to be used for correcting first data to be protected in which the error has occurred using a plurality of pieces of data to be protected that include the first data to be protected and are input every N pieces of data to be protected so that the first correction data are generated for each input data to be protected; and
generating second correction data to be used in correcting the first data to be protected in which the error has occurred, using a plurality of data to be protected that include the first data and are input every M pieces of data to be protected, so that the second correction data are generated for each input data to be protected.

12. A computer-readable storage medium storing computer-executable instructions for generating correction data for correcting data to be protected in which an error has occurred which, when executed by a computer, cause the computer to perform operations comprising:
inputting data to be protected;
generating first correction data to be used for correcting first data to be protected in which the error has occurred, using a plurality of pieces of data to be protected that include the first data to be protected and are input every N pieces of data to be protected, so that the first correction data are generated for each input data to be protected; and
generating second correction data to be used for correcting the first data to be protected in which the error has occurred, using a plurality of pieces of data to be protected, so that the second correction data are generated for each input data to be protected.

13. A computer-readable storage medium according to claim 12 further storing computer-executable instructions for generating, in response to an input of a first number of data to be protected, the first correction data and determining M and N so that a least common multiple of M and N becomes greater than or equal to the first number of data to be protected.

14. A generation method performed by an error-correction data generation apparatus for correcting data to be protected in which an error has occurred, the method comprising:

inputting data to be protected;

generating first correction data to be used for correcting first data to be protected in which the error has occurred, using the first data to be protected and N pieces of consecutively input data to be protected subsequent to the first data to be protected; and generating second correction data to be used for correcting the first data to be protected in which the error has occurred, using the first data to be protected and M pieces of consecutively input data to be protected subsequent to the first data to be protected.

15. A computer-readable storage medium storing computer-executable instructions for generating correction data for correcting data to be protected in which an error has occurred which, when executed by a computer, cause the computer to perform operations comprising:

inputting data to be protected;

generating first correction data to be used for correcting first data to be protected in which the error has occurred using the first data to be protected and N pieces of consecutively input data to be protected subsequent to the first data to be protected; and generating second correction data to be used for correcting the first data to be protected in which the error has occurred, using the first data to be protected and M pieces of consecutively input data to be protected subsequent to the first data to be protected.

16. A computer-readable storage medium according to claim 15 further storing computer-executable instructions for generating, in response to an input of a first number of data to be protected, the first correction data and determining M and N so that a least common multiple of M and N becomes greater than or equal to the first number of data to be protected.

\* \* \* \* \*